(12) United States Patent
Hung et al.

(10) Patent No.: US 10,868,163 B2
(45) Date of Patent: Dec. 15, 2020

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Hung Hung, Kawasaki Kanagawa (JP); Akira Yoshioka, Yokohama Kanagawa (JP); Toru Sugiyama, Musashino Tokyo (JP); Masaaki Iwai, Yokohama Kanagawa (JP); Naonori Hosokawa, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 46 days.

(21) Appl. No.: 16/290,714

(22) Filed: Mar. 1, 2019

(65) Prior Publication Data

US 2020/0091331 A1 Mar. 19, 2020

(30) Foreign Application Priority Data

Sep. 18, 2018 (JP) .................. 2018-174319

(51) Int. Cl.
*H01L 29/778* (2006.01)
*H01L 29/20* (2006.01)
(Continued)

(52) U.S. Cl.
CPC ...... *H01L 29/7787* (2013.01); *H01L 29/2003* (2013.01); *H01L 29/205* (2013.01); *H01L 29/404* (2013.01); *H01L 29/4236* (2013.01)

(58) Field of Classification Search
None
See application file for complete search history.

(56) References Cited

U.S. PATENT DOCUMENTS 7,388,236 B2 6/2008 Wu et al.
7,573,078 B2 8/2009 Wu et al.
(Continued)

FOREIGN PATENT DOCUMENTS

JP 2015-170821 A 9/2015

*Primary Examiner* — Mounir S Amer
(74) *Attorney, Agent, or Firm* — Kim & Stewart LLP

(57) ABSTRACT

A semiconductor device includes first and second nitride semiconductor layers, a first electrode electrically connected to the first nitride semiconductor layer, a second electrode electrically connected to the first nitride semiconductor layer, a gate electrode between the first and second electrodes, a first field plate electrode electrically connected to the first electrode, a second field plate electrode between the gate electrode and the second electrode and electrically connected to the first electrode, a first conductive layer on the gate electrode, and a second conductive layer on the first conductive layer. A distance between the gate electrode and the second field plate electrode in a lateral direction is shorter than a distance between the first conductive layer and the second field plate electrode in the lateral direction, and is equal to or shorter than a distance between the second conductive layer and the second field plate electrode.

14 Claims, 3 Drawing Sheets

(51) Int. Cl.
*H01L 29/205* (2006.01)
*H01L 29/40* (2006.01)
*H01L 29/423* (2006.01)

(56) References Cited

U.S. PATENT DOCUMENTS

| | | | |
|---|---|---|---|
| 8,530,936 B2 | 9/2013 | Ishii | |
| 2007/0235775 A1* | 10/2007 | Wu | H01L 29/7787 257/288 |
| 2007/0254431 A1* | 11/2007 | Saito | H01L 29/7783 438/253 |
| 2014/0092638 A1 | 4/2014 | Nishimori et al. | |
| 2016/0079373 A1* | 3/2016 | Uchihara | H01L 29/402 257/409 |
| 2016/0190297 A1* | 6/2016 | Kudymov | H01L 29/404 257/76 |
| 2018/0076310 A1* | 3/2018 | Sheridan | H01L 29/7787 |

* cited by examiner

SEMICONDUCTOR DEVICE

CROSS-REFERENCE TO RELATED APPLICATION

This application is based upon and claims the benefit of priority from Japanese Patent Application No. 2018-174319, filed on Sep. 18, 2018, the entire contents of which are incorporated herein by reference.

FIELD

Embodiments described herein relate generally to a semiconductor device.

BACKGROUND

A semiconductor element such as a transistor or a diode is used for a circuit such as a switching power source circuit or an inverter circuit. The semiconductor element is required to have a high breakdown voltage and a low on-state resistance. Further, the breakdown voltage and the on-state resistance are in a trade-off relationship and determined by element materials.

As technology development is advanced to the level at which the low on-state resistance of the semiconductor element is substantially equal to that of silicon, which is a main material used for the semiconductor element. For that reason, the material of the semiconductor element may need to be changed to further increase the breakdown voltage or further decrease the on-state resistance. A nitride semiconductor such as a gallium nitride or an aluminum nitride gallium is used as a material for a semiconductor element. Such a nitride semiconductor provides both the higher breakdown voltage and the lower on-state resistance.

An electric charge between a gate and a drain ($R_{on} \cdot Q_{GD}$) standardized with the on-state resistance is known as a figure of merit of switching efficiency of a transistor. Lower $R_{on} \cdot Q_{GD}$ indicates better switching efficiency.

DETAILED DESCRIPTION

Figure 1:
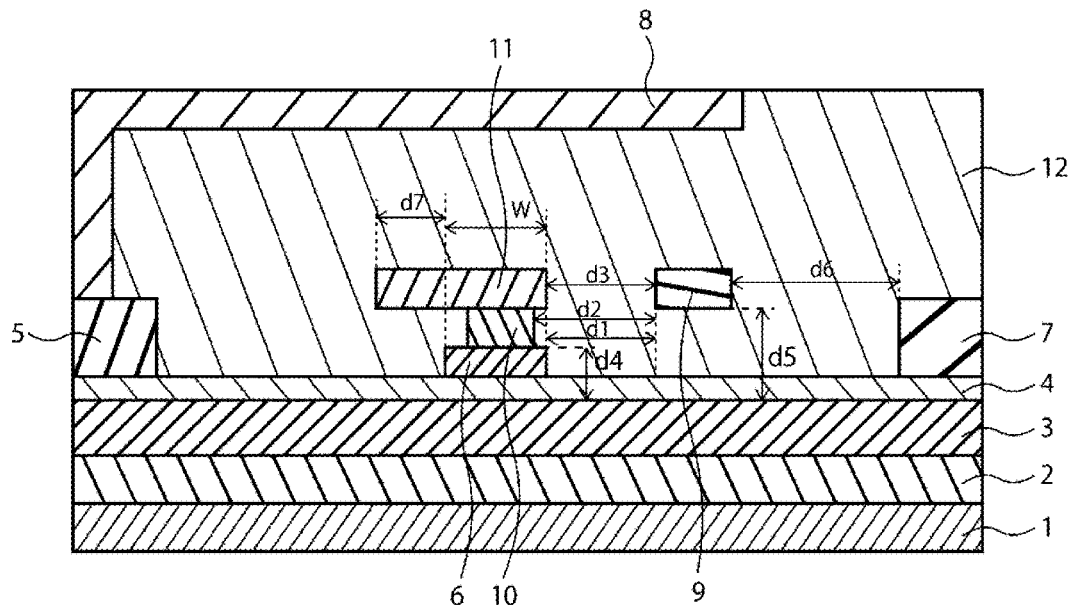
FIG. 1 illustrates a schematic cross-sectional view of a semiconductor device according to a first embodiment.

Embodiments provide a semiconductor device having excellent switching efficiency.

In general, according to an embodiment, a semiconductor device includes: a first nitride semiconductor layer; a second nitride semiconductor layer on the first nitride semiconductor layer and having a larger band gap than the first nitride semiconductor layer; a first electrode on the first nitride semiconductor layer and electrically connected to the first nitride semiconductor layer; a second electrode on the first nitride semiconductor layer and electrically connected to the first nitride semiconductor layer; a gate electrode between the first electrode and the second electrode; a first field plate electrode electrically connected to the first electrode; a second field plate electrode between the gate electrode and the second electrode and electrically connected to the first electrode; a first conductive layer on the gate electrode; and a second conductive layer on the first conductive layer. A first distance between the gate electrode and the second field plate electrode in the lateral direction is shorter than a second distance between the first conductive layer and the second field plate electrode in the lateral direction, and the first distance is equal to or shorter than a third distance between the second conductive layer and the second field plate electrode in the lateral direction.

Hereinafter, embodiments of the present disclosure will be described with reference to the drawings. Further, in the following description, the same or similar members are designated by the same reference numerals, and a description of the members, which are described once, may be omitted.

In the present specification, a "nitride semiconductor layer" includes a "GaN-based semiconductor". The "GaN-based semiconductor" is the general term for a semiconductor having a gallium nitride (GaN), an aluminum nitride (AlN), an indium nitride (InN), and an intermediate composition thereof.

In the present specification, "undoped" means impurity concentration equal to or lower than $2 \times 10^{16}$ cm$^{-3}$.

In the present specification, an upward direction in the drawings is referred to as "upward" and a downward direction in the drawings is referred to as "downward" in order to show a positional relationship between components. In the present specification, the concepts of the "upward" and the "downward" do not necessarily mean the terms that indicate a relationship related to a gravitational direction.

First Embodiment

A semiconductor device according to a first embodiment includes a first nitride semiconductor layer, a second nitride semiconductor layer positioned on the first nitride semiconductor layer and having a larger band gap than the first nitride semiconductor layer, a first electrode (source) positioned on the first nitride semiconductor layer and electrically connected to the first nitride semiconductor layer, a second electrode (drain) positioned on the first nitride semiconductor layer and electrically connected to the first nitride semiconductor layer, a gate electrode positioned between the first electrode (source) and the second electrode (drain), a first field plate electrode (SFP1) connected to the first electrode (source), a second field plate electrode (SFP2) electrically connected to the first electrode (source) and positioned between the gate electrode and the second electrode (drain), a first conductive layer positioned on the gate electrode, and a second conductive layer positioned on the first conductive layer. A first distance (d1) between the gate electrode and the second field plate electrode in a direction from the first electrode (source) toward the second electrode (drain) is shorter than a second distance (d2) which is a distance between an end surface of the first conductive layer on the side of the second electrode (drain) and the second field plate electrode in the lateral direction from the first electrode (source) toward the second electrode (drain). The first distance (d1) is equal to or shorter than a third distance (d3) which is a distance from an end surface of the second conductive layer, on the side of the second electrode (drain), to the second field plate electrode in the lateral direction from the first electrode (source) toward the second electrode (drain).

FIG. 1 illustrates a schematic cross-sectional view of the semiconductor device according to the first embodiment. The semiconductor device is a high electron mobility transistor (HEMT) 100 using a GaN-based semiconductor.

The HEMT 100 includes a substrate 1, a buffer layer 2, a channel layer 3 (first nitride semiconductor layer), a barrier layer 4 (second nitride semiconductor layer), a source electrode 5 (first electrode), a gate electrode 6, a drain electrode 7 (second electrode), a first field plate electrode 8, a second field plate electrode 9, a first conductive layer 10, a second conductive layer 11, and an interlayer insulating layer 12.

The substrate 1 is made of, for example, silicon (Si). In addition to silicon, for example, sapphire ($Al_2O_3$) or silicon carbide (SiC) may be applied to the substrate 1.

The buffer layer 2 is provided on the substrate 1. The buffer layer 2 serves to relax the lattice mismatch between the substrate 1 and the channel layer 3. The buffer layer 2 has, for example, a multilayer structure of aluminum nitride gallium ($Al_WGa_{1-W}N$ (0<W≤1)).

The channel layer 3 is provided on the buffer layer 2. The channel layer 3 is also called an electron transit layer. The channel layer 3 is, for example, undoped aluminum gallium nitride ($Al_XGa_{1-X}N$ (0≤X<1)). More specifically, the channel layer 3 is, for example, undoped gallium nitride (GaN). A film thickness of the channel layer 3 is, for example, 0.1 µm to 10 µm.

The barrier layer 4 is provided on the channel layer 3. The barrier layer 4 is also called an electron supply layer. A band gap of the barrier layer 4 is larger than a band gap of the channel layer 3. The barrier layer 4 is, for example, undoped aluminum gallium nitride ($Al_YGa_{1-Y}N$ (0<Y≤1, X<Y)). More specifically, the barrier layer 4 is, for example, undoped $Al_{0.25}Ga_{0.75}N$. A film thickness of the barrier layer 4 is, for example, 2 nm to 100 nm.

A heterojunction interface exists between the channel layer 3 and the barrier layer 4. A 2-dimensional electron gas (2DEG) is formed on the heterojunction interface results to high carrier concentration and mobility at the channel layer of HEMT 100.

The first electrode 5 is, for example, a source electrode. The source electrode 5 is provided on the channel layer 3 and the barrier layer 4. The source electrode 5 is electrically connected to the channel layer 3 and the barrier layer 4. The source electrode 5 is, for example, in direct contact with the barrier layer 4.

The source electrode 5 is, for example, a metal electrode. The source electrode 5 has, for example, a stack structure of titanium (Ti) and aluminum (Al). An ohmic contact may be present between the source electrode 5 and the barrier layer 4.

The gate electrode 6 is provided on the channel layer 3 and the barrier layer 4. The gate electrode 6 is electrically connected to the channel layer 3 and the barrier layer 4. The gate electrode 6 is, for example, in direct contact with the barrier layer 4. The gate electrode 6 is provided between the source electrode 5 and the drain electrode 7.

The gate electrode 6 is, for example, titanium nitride (TiN).

A non-illustrated gate insulating layer is provided between the gate electrode 6 and the barrier layer 4, such that the semiconductor device 100 may be a metal insulator semiconductor (MIS) type HEMT. The gate insulation layer is, for example, oxide or oxynitride. The gate insulation layer is, for example, silicon oxide, aluminum oxide, silicon oxynitride, or aluminum oxynitride.

The drain electrode 7 is provided on the channel layer and the barrier layer 4. The drain electrode 7 is electrically connected to the channel layer 3 and the barrier layer 4. The drain electrode 7 is, for example, in contact with the barrier layer 4.

The drain electrode 7 is, for example, a metal electrode. The drain electrode 7 has, for example, a stack structure of titanium (Ti) and aluminum (Al). An ohmic contact may be present between the drain electrode 7 and the barrier layer 4.

A distance between the source electrode 5 and the drain electrode 7 is, for example, 5 µm to 30 µm.

Further, the source electrode 5 and the drain electrode 7 may be structured to be in direct contact with the channel layer 3.

The first field plate electrode 8 is electrically connected to the source electrode 5, extends in a direction toward the drain electrode 7, and is positioned above the gate electrode 6. The first field plate electrode 8 reduces the electric field in a lateral direction. The first field plate electrode 8 has the same electric potential as the source electrode 5. The gate electrode 6, the first conductive layer 10, the second conductive layer 11, and the second field plate electrode 9 are positioned between the extending portion of the first field plate electrode 8 and the second nitride semiconductor layer 4.

The second field plate electrode 9 is electrically connected to the source electrode 5 and positioned between the gate electrode 6 and the drain electrode 7 so as to be spaced apart from the channel layer 3 and the barrier layer 4. The second field plate electrode 9 reduces an electric field in the lateral direction. The interlayer insulating film 12 is positioned between the second field plate electrode 9 and the barrier layer 4. The second field plate electrode 9 has the same electric potential as the source electrode 5. An end surface of the first field plate electrode 8 on the side of the drain electrode 7 is positioned to be closer to the drain electrode 7 than an end surface of the second field plate electrode 9 on the side of the drain electrode 7.

The first conductive layer 10 is positioned on the gate electrode 6 and electrically connected to the gate electrode 6. The first conductive layer 10 is a contact between the gate electrode 6 and the second conductive layer 11. In the cross-sectional view in FIG. 1, the first conductive layer 10 is electrically and directly connected to the gate electrode 6 and the second conductive layer 11. The first conductive layer 10 is positioned between the gate electrode 6 and the second conductive layer 11. A width (distance in a direction from the source electrode 5 toward the drain electrode 7) of the first conductive layer 10 is narrower than a width of the gate electrode 6. For example, the width of the first conductive layer 10 is equal to or less than 0.5 times the width of the gate electrode 6.

The first conductive layer 10 is, for example, a metal layer. The first conductive layer 10 is, for example, aluminum. Electrical resistivity (Ωm ohm·m) of the first conductive layer 10 is lower than electrical resistivity (Ωm ohm·m) of the gate electrode 6. The first conductive layer 10 has lower resistance than the gate electrode 6, such that electric resistance of the entire member from the gate electrode 6 to the second conductive layer 11 may be decreased. From the viewpoint of low resistance, the electrical resistivity (Ωm ohm·m) of the first conductive layer 10 may be equal to or lower than a half of the electrical resistivity (Ωm ohm·m) of the gate electrode 6.

The second conductive layer 11 is positioned on the first conductive layer 10 and electrically connected to the first conductive layer 10. In the cross-sectional view in FIG. 1, the second conductive layer 11 is electrically and directly connected to the first conductive layer 10. The second conductive layer 11 is positioned between the first field plate electrode 8 and the first conductive layer 10.

The second conductive layer 11 is, for example, a metal layer. The second conductive layer 11 is, for example, aluminum. The electrical resistivity (Ωm ohm·m) of the second conductive layer 11 is lower than the electrical resistivity (Ωm ohm·m) of the gate electrode 6. The second conductive layer 11 has lower resistance than the gate electrode 6, so that the electric resistance of the entire member from the gate electrode 6 to the second conductive layer 11 may be decreased. From the viewpoint of low resistance, the electrical resistivity (Ωm ohm·m) of the first conductive layer 10 and the electrical resistivity (Ωm ohm·m) of the second conductive layer 11 may be equal to or lower than a half of the electrical resistivity (Ωm ohm·m) of the gate electrode 6.

By providing the first conductive layer 10 and the second conductive layer 11, $Q_{GD}$ may be reduced and a preferable electric field distribution may be formed. An end surface of the first conductive layer 10 on the side of the drain electrode 7 and an end surface of the second conductive layer 11 on the side of the drain electrode 7 are positioned to be closer to the source electrode 5 than an end surface of the gate electrode 6 on the side of the drain electrode 7. That is, no field plate electrode is provided on the gate electrode 6. By adopting the gate field plate, a peak of an electric field between a gate and a drain may be decreased, but the $Q_{GD}$ is increased. By adopting the configuration of the embodiment, not only the peak of the electric field between the gate and the drain could be decreased but also the $Q_{GD}$ could be decreased simultaneously. By reducing the peak of the electric field between the gate and the drain, it is possible to prevent the device to breakdown due to exceeding the critical electric field. Further, the HEMT device 100 has excellent switching properties because the $Q_{GD}$ is decreased.

Figure 2:
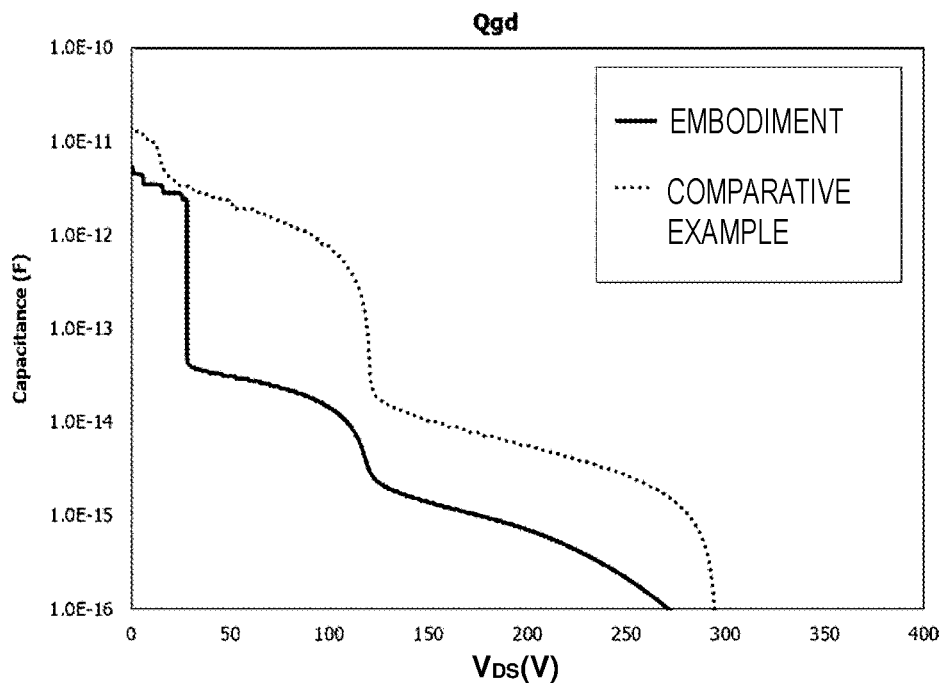
FIG. 2 illustrates a relationship between a gate-source voltage and a source-drain capacitance of semiconductor devices according to the first embodiment and a comparative example.
Figure 3:
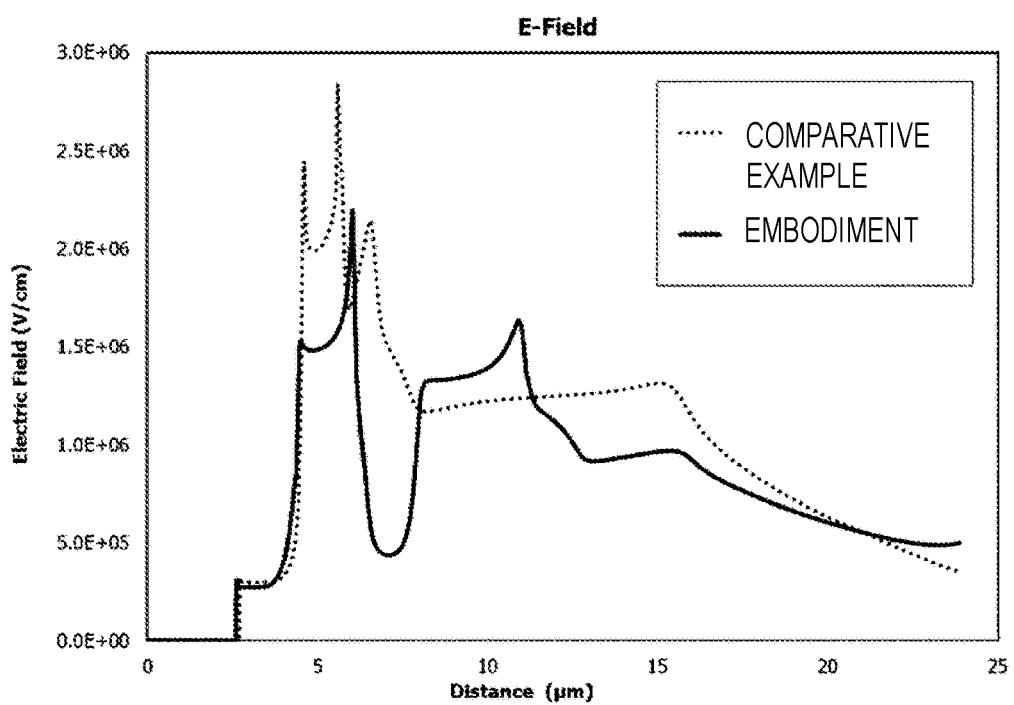
FIG. 3 illustrates an electric field distribution of the semiconductor devices according to the first embodiment and the comparative example.

FIGS. 2 and 3 are explanatory views illustrating an operation and an effect of the first embodiment. FIGS. 2 and 3 illustrate simulation results of a comparative example and the first embodiment. FIG. 2 is a graph illustrating a relationship between $Q_{GD}$ (vertical axis) and $V_{DS}$ (horizontal axis). FIG. 3 illustrates an electric field distribution (vertical axis) in a direction (horizontal axis) from the source electrode 5 toward the drain electrode 7. The comparative example is a semiconductor device in which the second field plate electrode 9 exists and the gate field plate electrode is used. Referring to FIGS. 2 and 3, it can be found that in the semiconductor device 100 of the embodiment, the $Q_{GD}$ is decreased and a preferable electric field distribution is achieved.

The following relationship may be satisfied to decrease the peak of the electric field between the gate and the drain and further decrease the $Q_{GD}$. The first distance (d1) between the gate electrode 6 (the end surface on the side of the drain electrode 7) and the second field plate electrode 9 (an end surface of the second field plate electrode 9 on the side of the source electrode 5) in the lateral direction from the source electrode 5 toward the drain electrode 7 may be shorter than the second distance (d2) between the first conductive layer 10 (the end surface on the side of the drain electrode 7) and the second field plate electrode 9 (the end surface of the second field plate electrode 9 on the side of the source electrode 5) in the lateral direction from the source electrode 5 toward the drain electrode 7. Further, the first distance (d1) may be equal to or shorter than the third distance (d3) between the second conductive layer 11 (the end surface on the side of the drain electrode 7) and the second field plate electrode 9 (the end surface of the second field plate electrode 9 on the side of the source electrode 5) in the lateral direction from the source electrode 5 toward the drain electrode 7. In other words, d1≤d3 and d1<d2 may be satisfied.

An end of the second conductive layer 11 on the side of the drain electrode 7 may be positioned to be on the side of the source electrode 5. In this case, 0.0 μm≤d3−d1≤0.3 μm may be satisfied. If (d3−d1) becomes too large, conductivity between the second conductive layer 11 and the gate electrode 6 may be decreased, which is not preferable.

A thickness (distance in a direction from the channel layer 3 toward the barrier layer 4) of the second conductive layer 11 may be equal to or larger than 10 times a thickness of the gate electrode 6. By using the second conductive layer 11 which is sufficiently thicker than the gate electrode 6, the resistance between the second conductive layer 11 and the gate electrode 6 is decreased.

The effect of low resistance is small if the width (distance in the surface direction from the source electrode 5 toward the drain electrode 7) of the second conductive layer 11 is narrow. For this reason, the end surface of the second conductive layer 11 on the side of the source electrode 5 may be positioned to be closer to the source electrode 5 than the end surface of the gate electrode 6 on the side of the source electrode 5.

From the viewpoint of reducing the peak of the electric field between the gate and the drain, a fourth distance (d4) between an upper surface (an end surface on the side of the first conductive layer 10) of the gate electrode 6 and the channel layer 3 (an end surface of the channel layer 3 on the side of the first conductive layer 10) in the vertical direction from the channel layer 3 toward the barrier layer 4 may be equal to or shorter than a fifth distance (d5) between the second field plate electrode 9 (an end surface on the side of the channel layer 3) and the channel layer 3 (the end surface of the channel layer 3 on the side of the first conductive layer 10) in the vertical direction from the channel layer 3 toward the barrier layer 4. In other words, d4 d5 may be satisfied. If d5 is too large, the second field plate electrode 9 becomes too close to the first field plate electrode 8, and an electric field dispersing effect of the second field plate electrode 9 is likely to be decreased. Therefore, 0.2 d5≤d4≤d5 may be satisfied. Even from the viewpoint of preventing electric current collapse, the aforementioned relationships may be satisfied.

From the viewpoint of reducing the peak of the electric field between the gate and the drain, the third distance (d3) may be 0.1 μm to 2.5 μm, and a sixth distance (d6), which is a distance between the end surface of the second field plate electrode 9 on the side of the drain electrode 7 and the drain electrode 7 (a surface of the drain electrode 7 on the side of the source electrode 5) in the lateral direction from the source electrode 5 toward the drain electrode 7, may be 2.0 μm to 20.0 μm.

From the viewpoint of decreasing resistance between the second conductive layer 11 and the gate electrode 6, a portion of the second conductive layer 11, which extends toward the source electrode 5, may be further prolonged. For that reason, a seventh distance (d7) between the second conductive layer 11 (the end surface on the side of the source electrode 5) and the gate electrode 6 (on the side of the source electrode 5) in the lateral direction from the source electrode 5 toward the drain electrode 7 may be equal to or longer than 0.2 times a width W of the gate electrode 6 in the vertical direction from the source electrode 5 toward the drain electrode 7. In other words, $d7 \geq 0.2 \cdot W$ may be satisfied. From a similar point of view, $d7 \geq 0.3 \cdot W$ may be satisfied. Further, if the portion of the second conductive layer 11, which extends toward the source electrode 5, is too long, an increase in capacitance Cgs between the gate and the source is not preferable. Therefore, $0.2 \cdot W \leq d7 \leq 0.9 \cdot W$ may be satisfied.

The interlayer insulating film 12 is, for example, oxide or nitride. The interlayer insulating film 12 is, for example, silicon oxide ($SiO_2$), silicon nitride (SiN), or a high dielectric (high-k) material. Examples of the high-k material may include hafnium oxide ($HfO_2$) and the like.

The semiconductor layer, the type of element in a semiconductor region, and element concentration may be measured by, for example, secondary ion mass spectrometry (SIMS) or energy dispersive x-ray spectroscopy (EDX). In addition, relative high or low element concentration may be determined based on high or low carrier concentration obtained by, for example, scanning capacitance microscopy (SCM). In addition, a distance such as a depth, a thickness, a width, and an interval of an impurity region may be obtained by, for example, SIMS. In addition, the distance such as the depth, the thickness, the width, and the interval of the impurity region may be obtained by, for example, a comparison image between an SCM image and an atom probe image.

Second Embodiment

Figure 4:
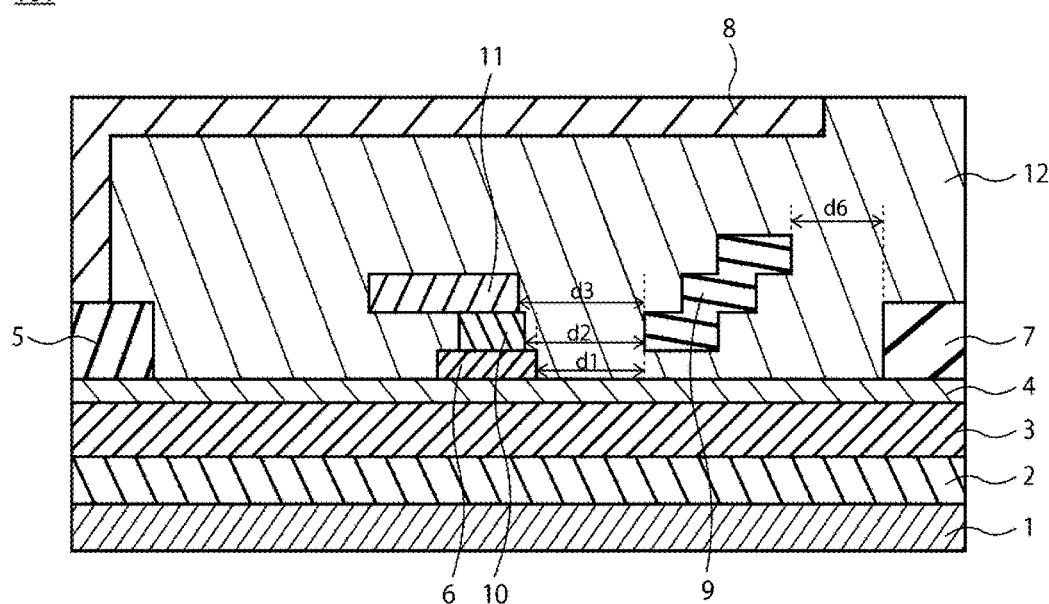
FIG. 4 illustrates a schematic cross-sectional view of a semiconductor device according to a second embodiment.

A semiconductor device according to a second embodiment is a modified example of the semiconductor device according to the first embodiment. FIG. 4 illustrates a schematic cross-sectional view of a semiconductor device 101 according to the second embodiment. The semiconductor device 101 according to the second embodiment has the same configuration as the semiconductor device 100 according to the first embodiment except that d1<d2<d3 is satisfied and the second field plate electrode 9 is formed in multiple steps. The second field plate electrode 9 formed in multiple steps is preferred from the viewpoint of further reducing the peak of electric field distribution. The second embodiment differs from the first embodiment in terms of the positional relationships among the end surface of the gate electrode 6, the end surface of the first conductive layer 10, and the end surface of the second conductive layer 11. However, similarly to the first embodiment, the second embodiment may also provide the semiconductor device 101 having excellent switching properties owing to the low $Q_{GD}$ while achieving good device lifetime because of the suppressed peak of the electric field between the gate and the drain.

Third Embodiment

Figure 5:
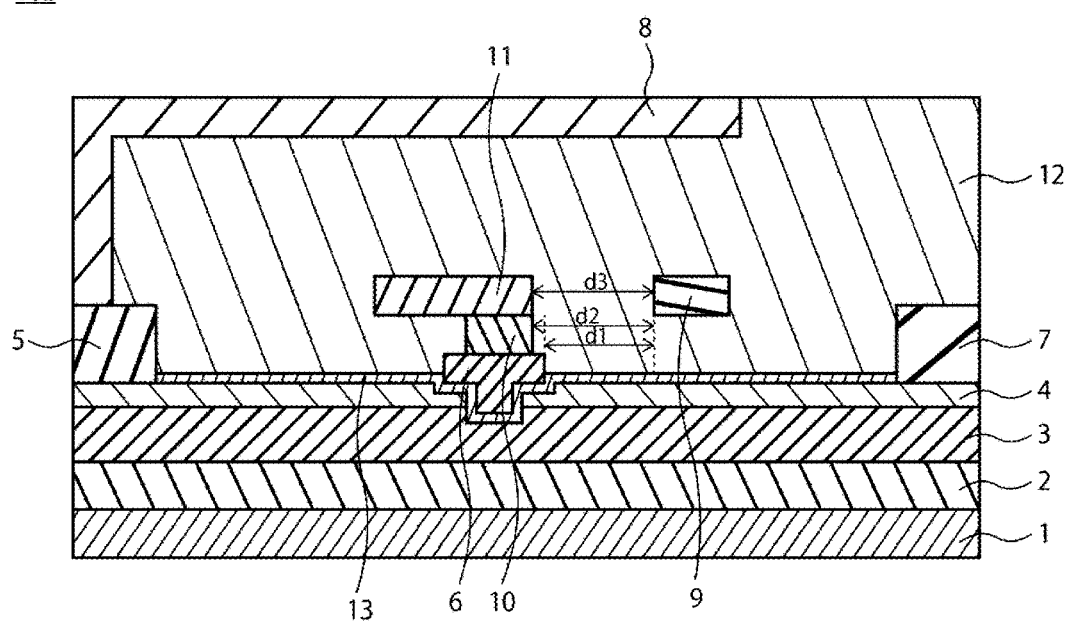
FIG. 5 illustrates a schematic cross-sectional view of a semiconductor device according to a third embodiment.

A semiconductor device according to a third embodiment is a modified example of the semiconductor device according to the first embodiment. FIG. 5 illustrates a schematic cross-sectional view of a semiconductor device 102 according to the third embodiment. The semiconductor device 102 according to the third embodiment has the same configuration as the semiconductor device 100 according to the first embodiment except that d1<d2, d1<d3, and d2=d3 are satisfied, a bottom surface of a trench (recess) is positioned in the channel layer 3, a gate insulating film 13 is further provided between the gate electrode 6 and the barrier layer 4 (channel layer 3), and the gate electrode 6 is positioned in the trench. A bottom surface of the trench is positioned in the channel layer 3, such that two-dimensional electron gas under the gate electrode 6 is not formed. With this configuration, the semiconductor device 102 may perform a normally OFF operation. Similarly to the first embodiment, the third embodiment, in which the gate electrode 6 has a structure different from those in the other embodiments, may also provide the semiconductor device 102 having excellent switching properties with low $Q_{GD}$ while keeping a uniform electric field distribution at the same time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first nitride semiconductor layer;
   a second nitride semiconductor layer on the first nitride semiconductor layer and having a larger band gap than the first nitride semiconductor layer;
   a first electrode above the first nitride semiconductor layer and electrically connected to the first nitride semiconductor layer;
   a second electrode above the first nitride semiconductor layer and electrically connected to the first nitride semiconductor layer;
   a gate electrode between the first electrode and the second electrode;
   a first field plate electrode connected to the first electrode;
   a second field plate electrode between the gate electrode and the second electrode and electrically connected to the first electrode;
   a first conductive layer on the gate electrode; and
   a second conductive layer on the first conductive layer,
   wherein a first distance between the gate electrode and the second field plate electrode in a lateral direction from the first electrode toward the second electrode is shorter than a second distance between the first conductive layer and the second field plate electrode in the lateral direction, and the first distance is equal to or shorter than a third distance between the second conductive layer and the second field plate electrode in the lateral direction.

2. The semiconductor device according to claim 1, wherein an electrical resistivity of the first conductive layer and an electrical resistivity of the second conductive layer are lower than an electrical resistivity of the gate electrode.

3. The semiconductor device according to claim 1, wherein a thickness of the second conductive layer is equal to or larger than 10 times a thickness of the gate electrode.

4. The semiconductor device according to claim 1, wherein an end surface of the second conductive layer on a side of the first electrode is closer to the first electrode than an end surface of the gate electrode on a side of the first electrode.

5. The semiconductor device according to claim 1, wherein a distance between an upper surface of the gate electrode and the first nitride semiconductor layer in a vertical direction is equal to or shorter than a distance between the second field plate electrode and the first nitride semiconductor layer in the vertical direction.

6. The semiconductor device according to claim 1, wherein the third distance is equal to or longer than 0.1 μm and equal to or shorter than 2.5 μm, and a distance between the second field plate electrode and the second electrode in the surface direction is equal to or longer than 2.0 μm and equal to or shorter than 20.0 μm.

7. The semiconductor device according to claim 1, wherein a distance between an end surface of the second conductive layer on a side of the first electrode and an end surface of the gate electrode on a side of the first electrode in the lateral direction is equal to or shorter than 0.2 times a width of the gate electrode in a vertical direction.

8. The semiconductor device according to claim 1, wherein a distance between the first electrode and the second electrode is equal to or longer than 5.0 μm and equal to or shorter than 30.0 μm.

9. The semiconductor device according to claim 1, wherein the second distance is longer than the third distance.

10. The semiconductor device according to claim 1, wherein the second distance is shorter than the third distance.

11. The semiconductor device according to claim 1, wherein the first field electrode extends over the second conductive layer and the second field plate electrode, and not over the second electrode.

12. The semiconductor device according to claim 1, wherein the second conductive layer is at least partially on the same level as the second field plate electrode above the second nitride semiconductor layer.

13. The semiconductor device according to claim 1, wherein the second conductive layer is at least partially on the same level as the first electrode and the second electrode above the second nitride semiconductor layer.

14. The semiconductor device according to claim 1, wherein the first nitride semiconductor layer and the second nitride semiconductor layer contain undoped aluminum gallium nitride.

* * * * *